United States Patent [19]

Forrest et al.

[11] Patent Number: 4,611,385
[45] Date of Patent: Sep. 16, 1986

[54] DEVICES FORMED UTILIZING ORGANIC MATERIALS

[75] Inventors: Stephen R. Forrest, Chatham; Martin L. Kaplan, Morris Plains; Paul H. Schmidt, Chatham, all of N.J.

[73] Assignee: AT&T Bell Laboratories, Murray Hill, N.J.

[21] Appl. No.: 602,700

[22] Filed: Apr. 23, 1984

Related U.S. Application Data

[63] Continuation-in-part of Ser. No. 389,909, Jun. 18, 1982, abandoned.

[51] Int. Cl.$^4$ ................. H01L 21/66; H01L 29/28
[52] U.S. Cl. ........................... 29/574; 357/8; 252/62.3 Q; 374/71.5
[58] Field of Search ................ 29/574; 357/8; 252/62.3 Q; 324/71.5

[56] References Cited

U.S. PATENT DOCUMENTS 3,428,892 2/1969 Meinhard ............ 252/62.3 Q
4,443,532 4/1984 Joy et al. ............ 430/270

FOREIGN PATENT DOCUMENTS 2636421 2/1978 Fed. Rep. of Germany ........ 357/8

OTHER PUBLICATIONS

Applied Physics Letters, vol. 41, No. 1, Jul. 1, 1982, p. 90, "Organic-on-Inorganic Semiconductor Contact Barrier Devices", S. F. Forrest et al.
Journal of Applied Physics, vol. 55, No. 6, Mar. 15, 1984, p. 1492, "Organic-on-Inorganic Semi. Contact Barrier Devices", S. F. Forrest et al.
Journal of Applied Physics, vol. 56, No. 2, Jul. 15, 1984, p. 543, "Organic-on-Inorganic Semi. Contact Barrier Devices", S. F. Forrest et al.

*Primary Examiner*—Brian E. Hearn
*Assistant Examiner*—T. Quach
*Attorney, Agent, or Firm*—Bruce S. Schneider

[57] ABSTRACT

The use of an organic material having a conjugated ring system such as 3,4,9,10-perylenetetracarboxylic dianhydride interfaced with a semiconductor material such as silicon yields quite acceptable rectifying properties. These properties are used to test the suitability of the substrate during processing. Additionally, these materials upon irradiation change refractive index, allowing production of optical devices such as gratings. The combination of electrical and optical devices formed using these organic materials also allows relatively simple fabrication of integrated opto-electronic structures.

10 Claims, 11 Drawing Figures

CONTOURS IN UNITS OF $10^{+15} cm^{-3}$

EPITAXIAL LAYER THICKNESS MAP

CONTOURS ARE IN MICRONS

CARRIER CONCENTRATION PROFILE VERSUS DEPTH
$N_D - N_A - \times 10^{-15} cm^{-3}$

DEVICES FORMED UTILIZING ORGANIC MATERIALS

CROSS-REFERENCE TO RELATED APPLICATION

This is a continuation-in-part of application Ser. No. 389,909, filed June 18, 1982, which is hereby incorporated by reference, now abandoned.

BACKGROUND OF THE INVENTION

1. Field of the Invention

This invention relates to rectifying devices and, in particular, rectifying devices involving dissimilar materials.

2. Art Background

Rectifying junctions are formed utilizing a variety of materials. For example, rectifying junctions are formed as homojunctions (two compositionally similar semiconductor materials), heterojunctions (two dissimilar semiconductor materials) and Schottky barriers (a junction formed between a semiconductor material and a material having a metallic conductivity). Irrespective of the materials employed to produce the rectifying interface, a specific set of electrical characteristics is desirable for most common applications such as photodetection and demodulation. In particular, as a first criterion, the reverse bias breakdown voltage should typically be greater than the largest voltage requiring rectification by the device. For applications such as low-voltage photodetection, this requirement makes a reverse bias breakdown greater than 5 volts generally desirable. As a second criterion, the forward bias characteristics should have an ideality factor generally equal to or smaller than 3.5. (Reverse breakdown voltage is defined in S. M. Sze, *Physics of Semiconductor Devices*, John Wiley & Sons, New York (1969) Chapter 2. The ideality factor, n, is defined by $I_F = I_s e^{qV/nkT}$ where $I_F$ is the forward current, $I_s$ is the saturation current, V is the voltage drop across the rectifying interface, q is the charge on an electron, k is Boltzmann's constant, and T is the temperature in degrees Kelvin.) The particular application in which a device is employed also imposes further strictures on the device characteristics. Investigations have involved a search for materials which will provide a device which satisfies the two general criteria, which satisfies the requirements set by the contemplated application, and which allows facile device fabrication. For example, many different materials have been investigated for use in photodiodes in an attempt to satisfy the ideality factor and breakdown requirements and to provide for the generation of a detectable photocurrent.

The advent of optical communications has even further increased the interest in photodiodes for use in integrated optical components and the search for suitable materials with which to fabricate these components. In these integrated components, light from the communication system is optically processed, e.g., the incoming signal consisting of a plurality of wavelengths is demultiplexed into a plurality of signals each essentially of, for example, one wavelength, and these individual signals are guided for further processing. In the same integrated component, the light is also electrically processed, e.g., the light signal which has been guided to a photodetector is converted into an electrical signal. In the fabrication of integrated optical components, it is desirable that both the optical devices (e.g., gratings and waveguides) and the signal-processing devices (e.g., rectifying junctions) be formed through a reasonably simple procedure on a substrate, e.g., a semiconductor substrate. This processing goal puts further restraints on materials contemplated for such uses. It has, therefore, been difficult to find materials that yield the appropriate electrical properties for rectifying devices, the appropriate optical properties for optical devices, e.g., gratings and waveguides, and at the same time offering the characteristics necessary for the relatively simple production of the entire integrated component.

SUMMARY OF THE INVENTION

Advantageous rectifying and optical devices such as photodetectors and gratings, respectively, are producible and integratable through the use of an organic material including 3,4,9,10-perylenetetracarboxylic dianhydride (PTCDA), 1,4,5,8-naphthalenetetracarboxylic dianhydride (NTCDA), 1,8-naphthalic anhydride (NA), diimides and imides of the perylene dianhydride, diimides and imides of the naphthalene dianhydride, or combinations of these materials. To produce desirable rectifying devices, an interface is formed between a suitable organic material and an inorganic semiconductor material such as silicon, indium phosphide or indium gallium arsenide phosphide. By appropriately choosing an inorganic semiconductor material having an appropriate majority carrier concentration and interfacing it with the organic material, rectifying junctions are produced with exemplary reverse breakdown voltages such as 250 and 60 volts with ideality factors of 1.7 and 1.5, respectively, and with suitable absorption for electromagnetic radiation.

Additionally, the organic materials employed in the inventive structures are energy sensitive. Upon exposure to appropriate energy, they undergo a refractive index change. Optical components such as diffraction gratings are producible by irradiating the organic material in a suitable pattern. Thus, these organic materials through an unusual set of properties avoid the complications associated with typical device fabrication methods, e.g., thermal diffusion, while providing the desired electrical properties. Because of the simplicity of forming both suitable optical devices such as diffraction gratings and suitable rectifying devices with these organic materials, the fabrication of integrated opto-electronic components is considerably simplified.

It has also been found that diodes formed utilizing the organic materials employed in the inventive structures are useful, for example, in quality control applications. In particular, these rectifying junctions are employable for determining (1) the carrier concentration profile in both vertical and lateral dimensions of a semiconductor region and (2) the thickness of such regions. It is thus possible to determine whether a semiconductor region of, for example, a substrate being processed to produce devices, is suitable for such device formation.

DETAILED DESCRIPTION

Figure 1:
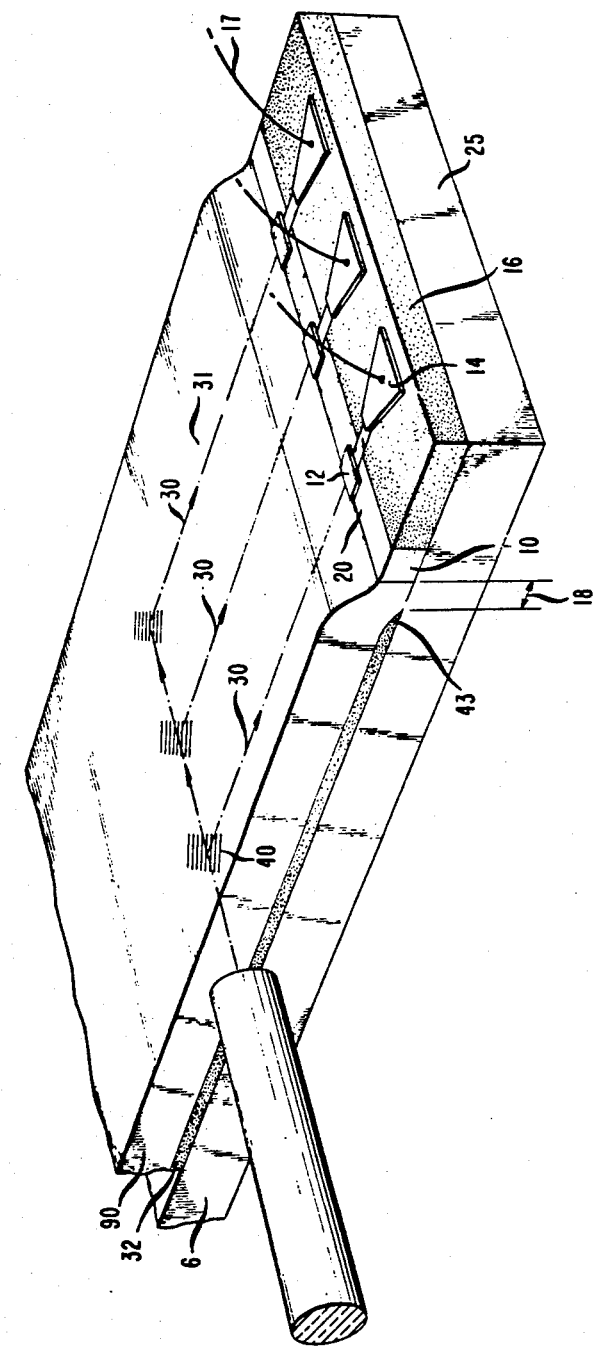
FIGS. 1 and 2 are schematic representations of illustrative devices within the subject invention.

To achieve the desired optical and electrical properties, fused-ring, organic compounds are employed. These compounds include PTCDA, NTCDA, NA, and imides and diimides of PTCDA or NTCDA, respectively, where the diimides are represented by the structural formulae

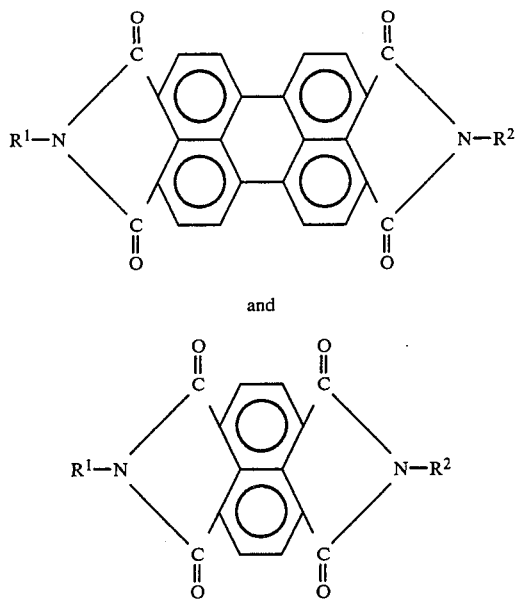

and where preferably $R^1$ and $R^2$ are hydrogen, aromatic moieties such as phenyl, substituted aromatic moieties, and alkyls or substituted alkyls, for example, having between 1 and 12 carbon atoms. ($R^1$ and $R^2$ need not be equivalent.) The imides are represented by the same structural formula except the N—$R^1$ is replaced by an oxygen atom. The particular $R^1$ and $R^2$ employed is not critical provided the resulting compound is depositable without chemical modification or decomposition. The $R^1$ and $R^2$ essentially do not affect the electrical properties of the electrical device produced by employing these diimides or imides. The optical properties are slightly affected, and in fact the R substituents are employable to adjust the wavelength at which the materials absorb electromagnetic radiation.

The particular inorganic semiconductor material utilized to form a rectifying junction with these organic materials depends on the ultimate application. Typically, semiconductor materials including gallium arsenide, indium phosphide, indium gallium arsenide phosphide, silicon, and gallium aluminum arsenide are useful when interfaced with these organic materials. For devices employing the delineated organic materials, the reverse breakdown voltage is primarily determined by the interfacing inorganic semiconductor material in a manner described by Sze supra Chapter 2. Ideality factors as low as 1.5 are also obtainable using these semiconductor materials as an interfacing material.

To form the desired organic material layer, conventional techniques such as sublimation are employed to deposit the organic material. In the sublimation technique, a crucible containing the desired, purified organic material, e.g., PTCDA, NTCDA, NA, or a combination of these compounds is placed in a vacuum chamber (evacuated, for example, to $10^{-6}$ Torr) and is, for example, resistively heated. (The means of purifying the organic material is not critical. However, good purity is obtained by gradient sublimation. See Guttman and Lyons, *Organic Semiconductors Part A*, Robert Krieger Publishing Company, Florida (1981) Chapter 3. Additionally, since the compounds typically are obtained commercially in powder form, it is advantageous to confine the crystalline materials to the crucible with a material such as quartz wool. The imidies or diimides are easily synthesized by reacting the NTCDA or PTCDA with the desired amine with the mole ratio of amine to NTCDA or PTCDA determining if the diimide or imide is produced.) The substrate to be coated is, for example, a body whose surface includes a bulk or epitaxial semiconductor material such as silicon, indium phosphide, indium gallium arsenide phosphide, gallium aluminum arsenide and/or an electrical insulator, e.g., silicon oxide, and/or materials with metallic conductivity. The substrate is mounted and proximity to the heated crucible so that the substrate is in the path of the vapor flow from the crucible.

Generally, the temperature employed to produce sublimation is not measured. The crucible temperature is merely raised until the sublimation of material is initiated as is shown by the appearance of sublimate on the substrate or as indicated by a thickness monitor such as a quartz crystal thickness monitor. The temperature of the source is increased through the resistive heating until sufficient sublimation occurs to produce a deposition rate in the range 5 to 100 Å per second. Slower deposition rates are inconvenient while faster deposition rates make thickness control difficult. For the organic materials of the invention, generally, temperatures above 300 degrees C. are employed. However, temperatures generally greater than 500 degrees C. not only make thickness control difficult, but also tend to decompose the materials and thus should be avoided.

The deposition is continued for a period sufficient to yield the desired film thickness. Typically, for regions where optical devices are to be formed, film thicknesses in the range 3000 Å to 2 μm are employed. (Regions thicker than 2 μm cause difficulties with the mechanical stability of the film.) The film thickness suitable for propagation of light through a waveguide depends on the refractive index of the material, the wavelength of the light to the guided, and the number of modes of light to be guided. The particular thickness used for a given number of modes, light wavelength and refractive index is described in *Integrated Optics*, D. Marcuse Ed. pages 12–30, IEEE Press, New York (1973). Additionally, for devices such as a transmission grating where light need not be guided, thinner layers, generally as thin as 500 Å, are useful. In regions where rectifying interfaces are produced, organic material thicknesses in the range 1000 to 3000 Å are generally utilized. Thicker regions are not desirable because they typically lead to unacceptably high series resistances. Thinner regions tend to result in pinholes and imperfections that lead to electrical shorts.

The devices are advantageously built on a substrate which is thick enough to furnish mechanical stability. In the region of this substrate where optical devices, if any, are to be formed, the composition of the substrate is not critical. However, if light is to be guided in the organic material, the interfacing material to this organic material should have a smaller refractive index than the organic material. If the interfacing material is, in turn, in contact with a material of higher refractive index, the thickness of the interfacing material should be chosen to prevent substantial leakage of light into this third region. (See Marcuse, supra for appropriate thickness for the interfacing material in this latter situation.) Similarly, it is possible to apply a layer or layers over the organic material in the region of optical and/or electrical devices. In optical regions, the adjoining layer of these overlying layers to the organic material should follow the same criterion concerning refractive index as described for the substrate material interfacing with the organic material.

On the other hand, if a rectifying device is desired, the organic material is deposited on a semiconductor material. Obviously, the particular materials chosen to interface with the organic material depends on the type of device which is desired. (The majority carrier concentration of the inorganic semiconductor varies somewhat and is tailored to the application as discussed by Sze, supra Chapter 2.) Since in integrated optical components both electrical and optical devices are employed, it is possible to utilize a substrate which has regions on its surface of semiconductor material and if desired, regions of other materials such as silicon oxide or silicon nitride. If the substrate is a bulk semiconductor material, it is possible to form the desired rectifying junctions by directly depositing the organic material on it. It is also possible to form the rectifying interface between the organic material and an epitaxial semiconductor layer which is part of the substrate.

Figure 5:
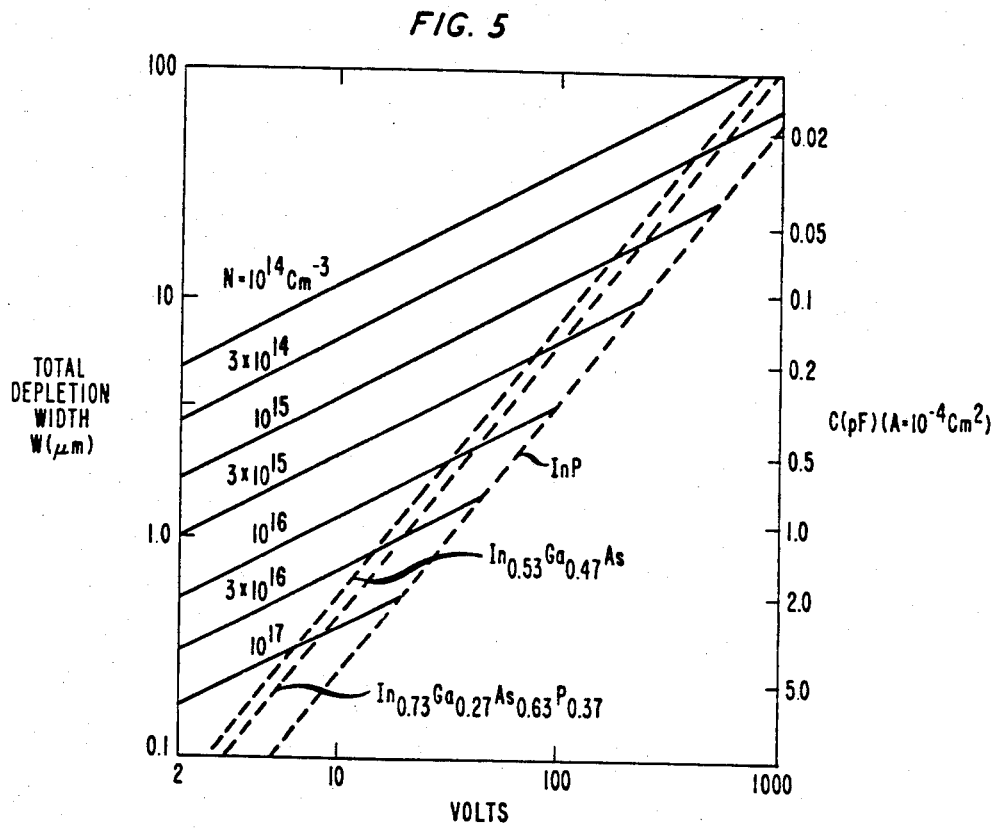
FIGS. 5, 6, and 7 are illustrative of properties and configurations of the inventive devices.

For photodetector applications, a semiconductor material is employed in the substrate to absorb light to be detected. It is possible that this semiconductor material is utilized to form the rectifying interface with the organic material or that the absorbing semiconductor material is removed from the rectifying interface. In either case, it is desirable that the light to be detected be substantially absorbed within the depletion region formed at the rectifying interface and extending into the semiconductor material. Two factors influence whether this criterion is satisfied. The first factor is the width of the depletion region, i.e., the distance the depletion region extends into the semiconductor materials adjoining the rectifying interface which, as shown in FIG. 5, is a function of the applied voltage and majority carrier concentration of the semiconductor material. The voltage applied obviously is less than the breakdown voltage of the device. Typically, practical voltages are significantly less than this voltage and generally produce a depletion region that extends 1 to 50 $\mu$m into a semiconductor material having a nominal majority carrier concentration. (Majority carrier concentrations less than $10^{16}$ are employed for most photodiode applications.) Given the practical limitations on the size of the depletion region, the second factor, the absorption coefficient of the absorbing semiconductor material, determines whether the light to be detected is absorbed in the depletion region. Typically, for a substantial collection of carriers produced by light absorption, it is desirable that the width of the depletion region be at least equal to the inverse of the absorption coefficient, and preferably at least twice the inverse of the absorption coefficient.

Figure 6:
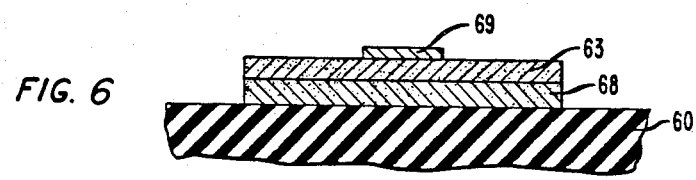
Figure 7:
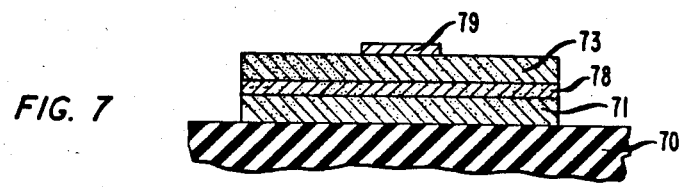

To exemplify two possible photodetector configurations, it is possible to form a photodetector by depositing an appropriate organic material, 63, in FIG. 6 onto indium phosphide, 68, which is on a substrate, 60. For a carrier concentration of $5\times10^{15}$ cm$^{-2}$ (as shown in FIG. 5 where N refers to the carrier concentration) and a bias of 80 volts as applied at contact, 69, the depletion region extends approximately 3 $\mu$m into the indium phosphide. Indium phosphide for light in the wavelength range less than 0.95 $\mu$m has an absorption coefficient of $10^4$ cm$^{-1}$. Therefore, the absorption criterion is satisfied. Similarly, photodetectors are producible which are sensitive to light of wavelength less than 1.6 $\mu$m, by employing an organic material, 73, in FIG. 7 interfaced with a thin layer of indium phosphide, 78, e.g., an indium phosphide layer having a thickness in the range 100 to 5000 Å. In turn, this indium phosphide layer on a substrate, 70, is interfaced with a layer of In$_{0.53}$Ga$_{0.47}$As, 71. As is shown in FIG. 5, for a typical carrier concentration, e.g., $5\times10^{15}$ cm$^{-2}$ and a bias, e.g., 25 volts as applied at contact, 79, the depletion region extends through the indium phosphide layer and a distance into the In$_{0.53}$Ga$_{0.47}$As of 2 $\mu$m less the thickness of the indium phosphide layer. Since In$_{0.53}$Ga$_{0.47}$As has an absorption coefficient of about $10^4$ cm$^{-1}$ at a wavelength less than 1.6 $\mu$m, once again the appropriate criterion is satisfied. (It should be noted that in ternaries such as indium gallium arsenide and in quaternaries such as indium gallium arsenide phosphide, it is possible to increase the absorption coefficient in a particular wavelength range by adjusting the composition of the semiconductor material. Thus, by appropriately adjusting the composition, it is possible to prepare a material that satisfies the absorption criterion for a variety of wavelengths.)

Electrical contacts are made to the inorganic semiconductor material of the rectifying device by conventional techniques such as filament evaporation followed by diffusion. It is advantageous that these contacts produce a series resistance of less than 50 ohms. To produce an advantageous contact to the organic materials, titanium, lead, tin, or indium contact are utilized. These metals are deposited as contacts, for example, by filament or electron beam evaporation. The contact is degraded if during its deposition the temperature of the organic material is substantially increased above room temperature. Various expedients are available to avoid this elevation. For example, the substrate is cooled and/or the substrate is removed a distance of from 10 to 25 cm from the metal evaporation source. To produce integrated optical components, the organic material is formed on the substrate, for example, by sublimation as previously described. Through the use of conventional photolithography it is possible to deposit an organic material thickness in one area for optical devices and a different thickness in another area of the integrated device for the production of electrical devices. Refractive index changes in the organic material to produce optical devices are accomplished by subjecting these materials to radiation such as ion beam, electron beam, or light absorbed by the organic material. Generally, a sufficient dose of energy is employed to produce the desired refractive index change. For typical optical devices employed in integrated optics, optical changes greater than 0.1 percent are appropriate. For example, to achieve such changes, generally a dose in the range $10^{12}$ cm$^{-2}$ to $10^{13}$ cm$^{-2}$ of 2 MeV argon ions or $10^{13}$ cm$^{-2}$ to $10^{15}$ cm$^{-2}$ of 20 KeV gallium ions is employed. Alternatively, a laser emitting at a wavelength within an absorption band of the material is employed at a sufficient power to produce the required refractive index change. A control sample is employed to determine an appropriate energy source and dose for a desired optical change. For example, to produce a transmission diffraction grating in PTCDA, an argon laser supplying a dose of approximately $2 \times 10^5$ watts/cm$^2$ with maximum intensities at 4880 Å and 5140 Å and emission in the range 4580 Å to 5145 Å is utilized to produce lines of irradiated material that are spaced 9.5 μm apart.

Exemplary of integrated components producible by the subject invention are multiplexers and demultiplexers. As illustrative of multiplexers and demultiplexers producible by the subject invention are those shown in FIGS. 2 and 1, respectively. (See T. Suhara et al, *Applied Physics Letters,* 40, 120 (1982) for a demultiplexing device utilizing an associated configuration and different materials. The regions, 20, in FIGS. 1 and 2 in the organic material below the metal contacts, 12, refer to the vicinity of the photodiodes while regions, 30, refer to waveguides and regions, 40, to diffraction gratings. The integrated components are formed on a substrate, 6, e.g., a silicon or indium phosphide substrate. The photodiodes are formed beneath contact pads, 12, between the semiconductor material of the substrate and a region of organic semiconductor material, 10. The metalization indicated by, 12, is the diode field plate and the metalization, 14, overlying an insulator, 16, such as silicon dioxide is the bonding pad.

Figure 2:
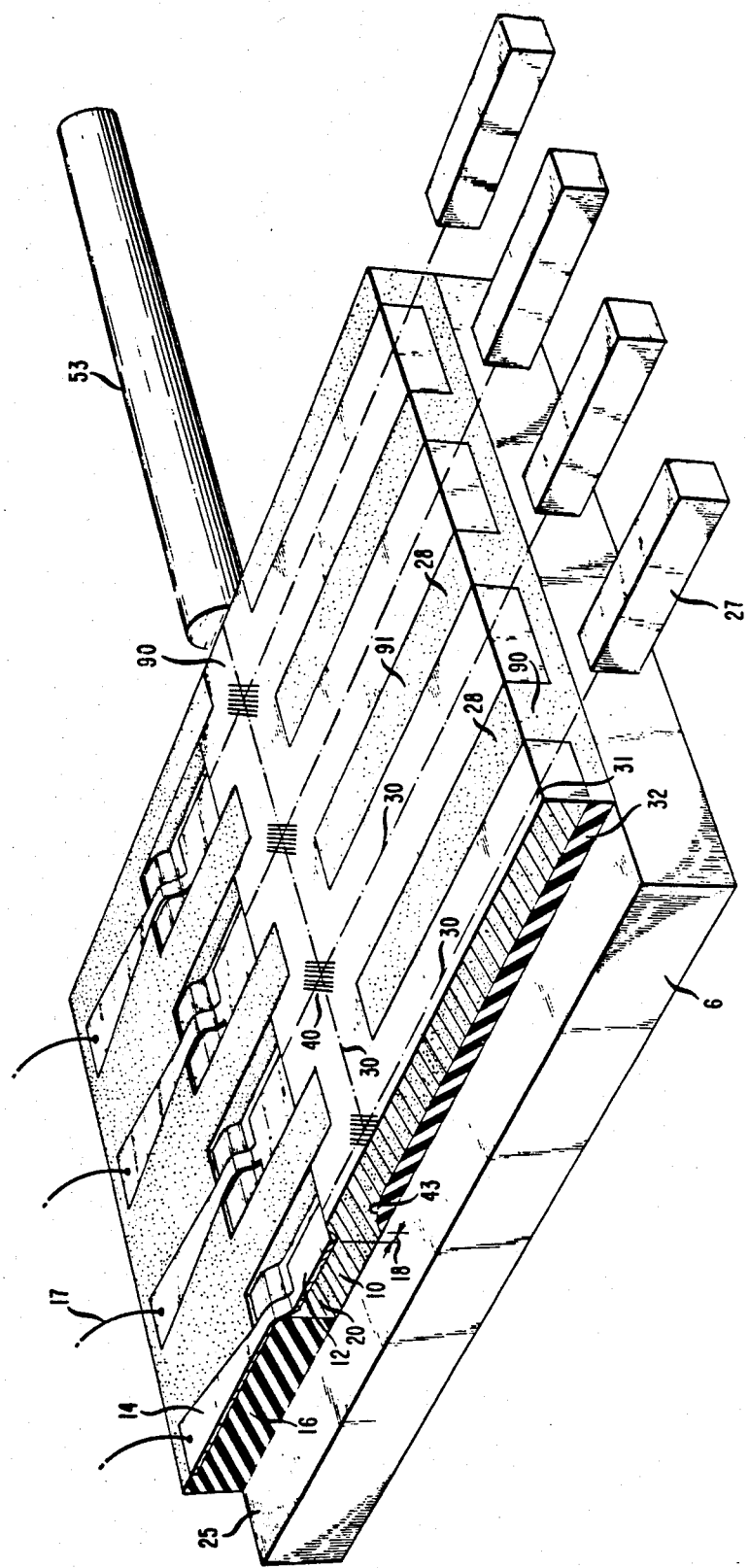

In each case, the waveguide portion of the component as indicated by, 30, is formed by the organic material, 31, which overlies a region of lower refractive index such as a silicon oxide region, 32. The thickness of the region of lower refractive index is chosen as previously discussed and is typically a thickness in the range 2000 to 5000 Å. To ensure that guided light in the waveguide is in fact absorbed in the depletion region of the photodiode, the edge of the region of higher refractive index, 43, is tapered, and is also removed a distance, 18, from the terminus of the field plate, generally in the range of from 3 to 5 times the longest wavelength of the electromagnetic radiation being guided. This spacing is done to ensure that the incoming guided light is not reflected back down the waveguide due to the narrowing of the waveguide in the detector region. Typically the organic material in the waveguiding portion is made to be a thickness in accordance with Marcuse, supra (generally approximately 1 μm thick) and the organic material thickness under the field plate is made to be less than 3000 Å. As indicated, the bonding pad is insulated from the inorganic semiconductor material active region using a dielectric such as silicon dioxide in region, 16. The thickness of this dielectric region is sufficient to prevent inversion of the majority carrier type of the underlying semiconductor material, 25, at the operating voltage (See Sze supra Chapter 6 for suitable thicknesses.) Gratings at an appropriate angle in conformance to the Bragg condition to demultiplex incoming light as shown in FIG. 1 or to multiplex light from small area sources such as lasers, edge-emitting diodes, 27, in FIG. 2 are written as previously discussed, for example, with an ion beam. The structure of FIG. 2 is particularly noteworthy for its use of a photodetector as a monitor to indicate whether the corresponding light source is functioning. Since the light source is very close to the grating and since the grating is never 100 percent efficient, some light is transmitted to the photodetector rather than being diffracted to the fiber. Thus, by monitoring the photodetector signals, it is possible to ascertain whether a corresponding light source is functioning.

The configurations of FIGS. 1 and 2 are produced by conventional techniques in essentially the same manner. The substrate, 6, is coated in the waveguide regions with a layer such as a silicon dioxide layer to a suitable thickness as previously discussed and this layer is patterned by conventional lithographic techniques. The organic material is deposited by, for example, sublimation to a thickness commensurate with that employed in the diode region, 20. Deposition of the matallic layer, as previously discussed, for the field plate and bonding pad is then performed by conventional photolithographic techniques in conjunction with deposition by techniques such as thermal evaporation. The diode region and bonding pad is masked using conventional lithography. The organic material is then further deposited to bring the material to the full thickness of the unmasked region, 90. The mask is then removed. The diffraction gratings are written using energy such as ion beams as previously described. In the configuration of FIG. 2, the waveguide regions, 30, are advantageously bonded by regions of a dielectric of lower refractive index, 28, such as silicon dioxide and the width of these waveguiding regions is maintained so that the guided light does not diverge to an extent which makes the grating ineffective or precludes the coupling of the diffracted light into fiber, 53. The divisions, 91, are also useful in avoiding optical cross-talk between waveguides. Typically, waveguide widths in the range 25 μm to 75 μm are employed. (It is also possible to employ a curved grating to focus a divergent light beam.) Contact, 17, to the bonding pad is made simply by techniques such as thermal compression or adhesive bonding.

The use of the organic materials of this invention are not confined to diode devices. These materials are useful generally where a rectifying junction is to be formed. For example, it is possible to form a field-effect transistor device using the inventive rectifying junction. This device includes an active region such as an indium phosphide active region with source and drain contacts, and with a gate formed by depositing, as discussed above, an appropriate organic material on the indium phosphide active region and an appropriate metal contact, on the organic material. Thus, the device is formed as described in the literature in Sze supra and the gate is formed as described above.

The rectifying junctions formed utilizing the previously discussed organic material are also useful in quality control applications. In particular, by forming a rectifying junction between (1) a suitable III–V material, e.g., indium phosphide, indium gallium arsenide, indium gallium arsenide phosphide, gallium arsenide, or gallium aluminum arsenide, or (2) silicon and the previously described organic materials, it is possible to measure a variety of significant device characteristics in regions depleted of majority carriers by, for example, application of an electric field across the organic/inorganic rectifying barrier. For example, characteristics of semiconductor regions underlying the organic/inorganic junction, such as (1) the carrier concentration profile in the inorganic semiconductor region and (2) the layer thicknesses, are discernible by performing C–V measurements. (Although the profile through a region is determinable, it is also possible to determine concentrations at specific points in the semiconductor region.) The electric field is generated, for example, by first forming contacts, as previously described, to the organic material and to the semiconductor material to which a voltage is applied. Contacts (one on the organic and one on the inorganic semiconductor) are formed to delimit the volume of the semiconductor material that is to be investigated. (Generally these contacts are opposing. However, it is also possible to form the contacts in, for example, essentially the same plane, provided one contact is on the organic semiconductor and one is on the inorganic semiconductor material. In either configuration, the volume that it is possible to profile is defined by the volume occupied by the electric field produced upon application of a voltage to the contacts.) A series of voltages is applied between the contacts, and the capacitance for each voltage is measured. By varying the voltage, it is possible to probe into the volume of the inorganic semiconductor region—the larger the voltage, the deeper the probe. The limitation on this probe depends on the region in which it is possible, by applying a voltage, to deplete the majority carriers. Depletion depends on the majority carrier concentration, i.e., intrinsic concentration plus dopant concentration, in a particular region and the voltage applied across this region. Applied voltage is, however, limited by the breakdown level for the inorganic semiconductor. (For some semiconductor materials, it is possible to increase this breakdown level by oxidizing the surface upon which the rectifying junction is formed. For example, indium phosphide is oxidized by subjecting it to $HNO_3$ or $H_2O_2$. If desired, this oxide is later removed by conventional expedients such as treatment with 1:4 HF in water.) Despite the requirement of depletion, a broad range of information is discernible with the inventive technique for typical devices having typical layer thicknesses, e.g., layers or combinations of layer thicknesses in the range 0.1 to 10 $\mu$m, and having typical carrier concentrations, e.g., concentrations in the range $\leq 10^{17}$ cm$^{-3}$.

From C-V measurements, the thickness of a depleted region is determinable using the calculations described in Sze supra, pages 90–92. Additionally, by also utilizing equations given in Sze supra, pages 90–92, it is possible by utilizing C-V measurements to determine the carrier concentrations through the vertical regions below each contact at which the voltage is applied. Thus, by measuring a C-V curve over a variety of voltages and by applying these voltages to contacts in various regions of the substrate, not only are layer thicknesses and carrier concentrations determinable, but three-dimensional profiles of thickness and carrier concentration are also discernible.

There are a few minor limitations on the resolution of this technique. In particular, compositional changes that involve a change in band energy to be detectable should be larger than 3kT, where k is the Boltzmann constant and T is the temperature in degrees Kelvin. Thus, the spatial position of two compositionally different regions is discernible at a distance in which the band energy level changes at least 3kT. Additionally, resolution is limited to a distance not smaller than a Debye length. (See *Physical Chemistry*, 4th Edition, W. J. Moore, Longmans, London, 1963, page 353, for a definition of Debye length.) Typically, these limitations on resolution do not in any way decrease the efficacy of the technique since the attainable resolutions are totally adequate for quality control procedures.

In manufacturing applications, regions of a substrate being processed are checked for suitable carrier concentration and region thickness by forming the previously described rectifying junctions and measuring the C-V characteristics through the region of interest. For relatively low cost substrates produced by a fabrication procedure that has excellent reproducibility, manufacture is generally performed by testing a representative substrate from a plurality of substrates. After the determination is made, the entire group of substrates is then either accepted for further device processing or rejected, depending on the desired level and acceptable gradient of carrier concentration and thickness for a particular application. In situations where the substrate is relatively expensive, such as is presently the case for III–V based semiconductor substrates, it is not desirable to discard an entire substrate. Thus, generally for such materials, the entire substrate is inspected, and regions of the substrate that do not satisfy desired characteristics for a particular application are ultimately discarded. (It is possible to employ the inventive technique to determine the suitability of a surface of a semiconductor for a particular application. The amplitude of the barrier formed between the semiconductor and the organic material is such an indication. The measured value is compared to the value obtained with a semiconductor material having the desired surface properties.)

After the measurement is made, the organic layer is employable in a rectifying junction of devices formed in the substrate, or if these particular devices are not desirable, the organic material is removable essentially without affecting the quality of the underlying semiconductor material. This removal is accomplished by dissolving the material in a solvent such as a base, e.g., an aqueous base such as aqueous KOH or benzyltrimethylammonium hydroxide. Thus, for example, to remove the organic materials (and overlying contact metallization), the substrate with its organic coating is immersed in an aqueous solution of KOH, typically for a period in the range of 1 to 3 minutes. It is possible to remove the residual KOH by subsequent water rinses. This immersion removes the layer without substantially affecting the inorganic semiconductor material.

EXAMPLE 1

A p-type silicon substrate having its major surface in the (100) plane and having a nominal resistivity of approximately 10 ohm-cm was degreased. A contact was formed on one of the major surfaces of the substrate through evaporation of approximately 1000 Å of aluminum onto the surface followed by heating for 20 minutes at 500 degrees C in a forming gas atmosphere. The substrate with its back contact was then ultrasonically cleaned in a commerical detergent solution. The back contact was protected using a mask and the substrate was subjected for 30 seconds to a 50/50 by volume solution of HF in water. The substrate was then sequentially rinsed in deionized water, immersed in ethyl alcohol, and dried in doubly filtered air.

The mask over the contact was immediately removed from the back contact, the substrate was clamped to a glass substrate holder, and the substrate holder inserted into a turbine-pumped vacuum chamber. Before loading the substrate into the chamber a tantalum crucible was first resistively heated in the evacuated chamber at 700 degrees C for one minute. The crucible was then cooled to room temperature and the vacuum chamber brought to atmospheric pressure. The crucible was loaded with approximately 50 mg of gradient sublimed PTCDA. (The PTCDA was gradient sublimed by inserting it in one end of a Pyrex tube. The vacuum-pumped ($10^{-2}$ Torr) Pyrex tube was, in turn, inserted into a brass tube that was heated to 430 degrees C on one end. The end of the Pyrex tube containing the PTCDA was aligned with the heated end of the brass tube. The heating was continued overnight resulting in vapor transport and condensation of the purified PTCDA in a redish-green band as distinguished from impurity bands which differed in color from the PTCDA). The chamber was further prepared by positioning the crucible with its quartz wool covered PTCDA charge in the vacuum station at a distance of 15 cm from where the substrate holder was to be mounted.

After the substrate was inserted, the chamber was evacuated to a pressure of $5 \times 10^{-5}$ Torr. The temperature of the crucible was rapidly raised by resistive heating until deposition at a rate of 25 Å per second was observed on the substrate as measured by a quartz crystal monitor. The deposition was continued until the PTCDA layer was 2000 Å thick. A shutter was then inserted between the crucible and the substrate and the heating of the crucible was discontinued. The tantalum crucible was cooled and the system as vented.

The substrate was removed from the vacuum chamber and a refractory metal mask having an array of 7 mil diameter holes placed in contact with the PTCDA layer. The tantalum crucible was replaced with a tungsten coil which had been wrapped with a 10 cm length of 20 mil titanium wire (99.97 percent pure). The substrate with its masked organic layer was inserted onto the sample holder, and the apparatus was again evacuated to a pressure of approximately $5 \times 10^{-5}$ Torr. The helical tungsten coil was rapidly heated to produce a titanium deposition rate on the organic layer of approximately 100 Å per second. The deposition was continued until titanium dots of 500 Å thickness were obtained on the organic material. A shutter was once again inserted between the evaporation source and the substrate. The evaporation source was cooled and the apparatus vented.

A random sample of the diodes produced on the wafer were tested. The typical electrical properties obtained for these diodes and the diodes described in subsequent examples are shown in Table 1. Consistent values were observed over a series of approximately 20 tested diodes.

TABLE 1

| Organic Material | Contact Metal | Ideality Factor | Breakdown Voltage ($V_B$) | Reverse Current* at ½ $V_B$ |
|---|---|---|---|---|
| PTCDA | Ti | 1.7 | 230 V | 40 nA |
| NTCDA | Sn | 3.0 | 235 V | 35 nA |
| NA | Ti | 1.5 | 55 V | 15 nA |

*Diode area = $2.5 \times 10^{-4}$ cm$^2$.

EXAMPLE 2

The procedure of Example 1 was followed except the organic material evaporated from the tantalum crucible was NTCDA. The NTCDA was purified by the gradient sublimation method where the end of the brass tube was heated to 250 degrees C. The purified NTCDA was pale yellow, while the impurities were of other colors. Additionally, during evaporation of the NTCDA the crucible was heated so that a deposition rate of 50 Å per second was achieved. A tin rather than titanium contact was formed on the organic material by first prewetting a helical tungsten heater with a pellet of 99.999 percent pure tin. Initially, the temperature of the tungsten helix was raised at a relatively slow rate so that it was outgassed and then the temperature raised at a more rapid rate to produce the desired 100 Å per second deposition rate.

Figure 3:
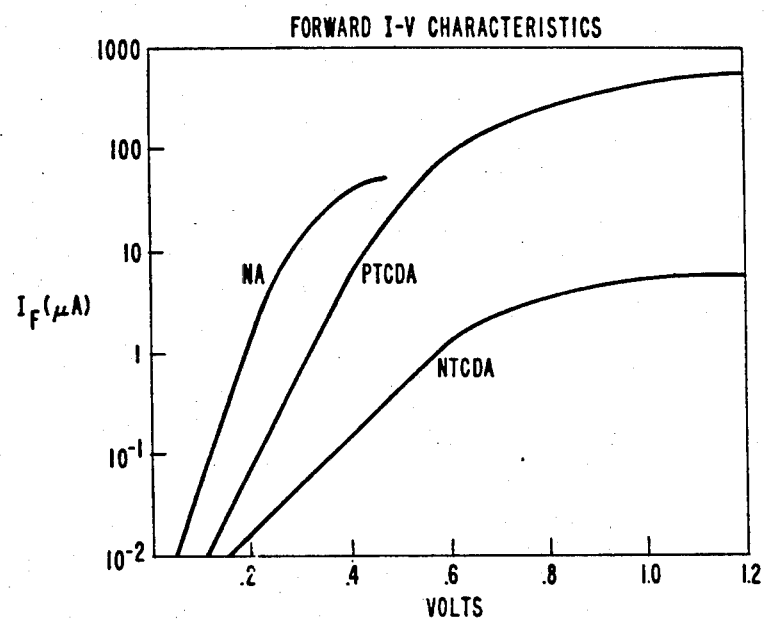
FIGS. 3 and 4 demonstrate electrical properties of devices within the subject invention.
Figure 4:
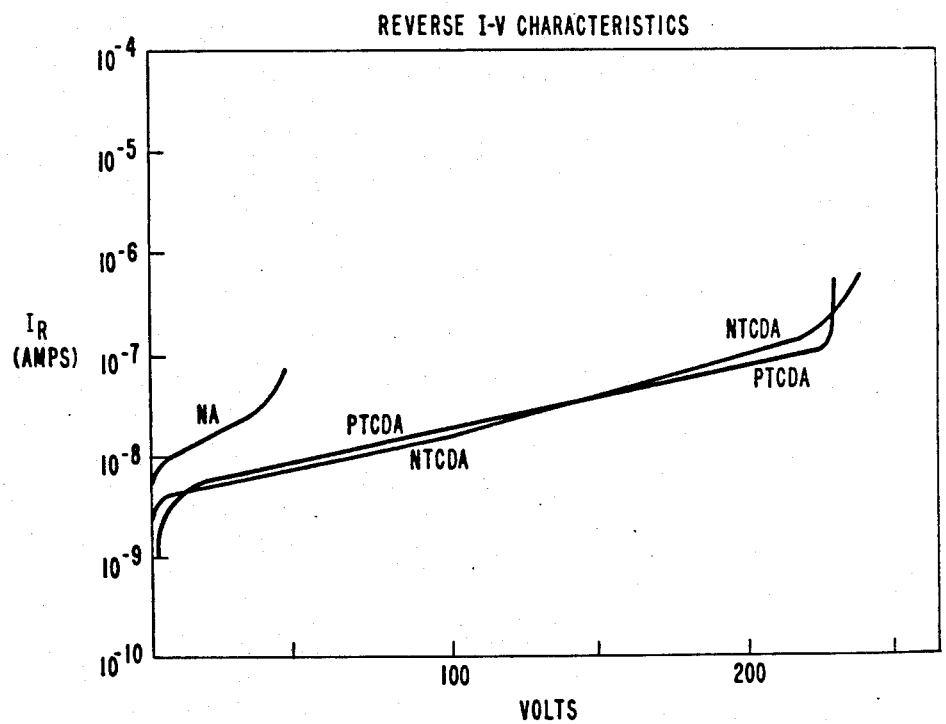

The properties obtained for the diodes thus formed are shown in the Table and in FIGS. 3 and 4.

EXAMPLE 3

The procedure of Example 1 was followed except the evaporated organic layer was an NA layer. The NA employed for evaporation was purified by gradient sublimation where the heated end of the brass tube was held at a temperature of approximately 200 degrees C.

The electrical characteristics and I-V curve are shown in the Table and FIGS. 3 and 4, respectively.

EXAMPLE 4

The procedure of Example 1 was followed except the organic material evaporated from the crucible was 3,4,9,10-perylenetetracarboxylic diimide. The diimide was used without purification by gradient sublimation. The electrical properties obtained were qualitatively similar to those obtained for PTCDA.

EXAMPLE 5

The procedure of Example 1 was followed except an indium contact was employed. This contact was formed by evaporation from a tungsten helical source that was prewetted with indium. The properties obtained were qualitatively the same as those achieved with the titanium contacted PTCDA.

EXAMPLE 6

The procedure of Example 1 was followed except the contact utilized was lead. This lead was evaporated from a tantalum crucible similar to that utilized for deposition of the organic material. The electrical characteristics obtained were qualitatively similar to those achieved with titanium contacted PTCDA.

EXAMPLE 7

A 5000 Å thick layer of PTCDA was deposited at a rate of 25 Å per second on a one-inch by three-inch cleaned glass slide by the evaporation procedure described in Example 1. The PTCDA utilized for this evaporation was purified as also described in Example 1 by the gradient sublimation technique. A laser was scanned in an appropriate pattern over approximately a one-half inch square area to form a grading with 9.5 μm lines separated by 9.5 μm spaces. The argon laser was employed having emission in the wavelength range of 4580 Å to 5145 Å with maximum intensity at 4880 Å and 5140 Å at a power of $2 \times 10^5$ watts per cm$^2$ with a beam cross-section of 25 μm. When light from a helium neon laser was incident at 90 degrees C. to the plane of the grating, this light was observed in the far field to be diffracted.

EXAMPLE 8

A 1.2 μm thick layer of NTCDA was deposited on a glass slide by the evaporation procedure described in Example 2. (The NTCDA had been purified as described in Example 2.) Light from the helium neon laser was coupled into the film utilizing a 90 degree prism coupler as described by P. K. Tien, *Applied Physics Letters,* 14, 291 (1969). The light was observed to be guided in the NTCDA material.

EXAMPLE 9

The same procedure as followed in Example 7 was used except a focused Ga+ 20 KeV ion beam was employed instead of the laser.

EXAMPLE 10

A silicon substrate having its major surface in the (100) plane and measuring 1×1 cm×20 mils thick was utilized. This substrate had a diffused aluminum ohmic back contact that was covered initially with wax to protect it from the subsequent cleaning procedure. To perform this cleaning procedure, the substrate was sequentially immersed in chloroform, acetone, and deionized water. The substrate was then immersed for 30 seconds in a 1:1 solution of deionized water and 50 percent HF in water. The substrate was then rinsed in deionized water. To remove the wax, the substrate was subsequently immersed in acetone and isopropanol and dried with doubly filtered dry air.

The substrate was placed on a glass microscope slide, was affixed to the slide utilizing a pressure contact, and placed on the sample holder of a sublimation deposition apparatus. A resistively heated tantalum sublimation source was positioned 15 cm below the substrate and was charged with PTCDA. Quartz wool was placed over the PTCDA to ensure that solid material was not injected into the apparatus. The apparatus was evacuated to a pressure of $1.5 \times 10^{-5}$ Torr. A shutter was maintained between the source and the substrate while the source was heated to an initial temperature of approximately 300 degrees C. for approximately 1 minute. The temperature of the source was then increased until a sublimation rate corresponding to a deposition rate in the range of approximately 5 Å per second to 10 Å per second was reached. The shutter was then opened, thus subjecting the substrate to a flux of PTCDA. The sublimation and resulting deposition were continued until a deposited layer thickness in the range 1000 Å to 2000 Å was reached. The shutter was then closed, the source allowed to cool to room temperature, and the apparatus was vented to air.

The substrate was removed from the apparatus, and a molybdenum multiple dot contact mask was contacted with the PTCDA layer. The dots of the mask were 8 mils in diameter and had a center-to-center spacing of approximately 400 μm. The sample was again inserted into the sublimation apparatus with the masked layer exposed. The sublimation procedure followed for PTCDA was repeated, except the source was a helical tungsten coil charged with 99.9999 percent pure indium. The indium was initially heated to a red heat and then further heated to yield a deposition rate of between 200 Å per second and 500 Å per second. Deposition was continued to produce an indium layer having a thickness of between 3000 Å and 5000 Å.

The substrate was placed in a standard probe station. The probe had a gold wire tip of 2 mils in diameter. The capacitance was measured at several applied voltages up to barrier breakdown. The data was evaluated by standard analysis techniques described by Sze supra and indicated a bulk resistivity of approximately 10 ohm-cm.

EXAMPLE 11

The procedure of Example 10 was followed except the substrate was a wafer of indium phosphide that had an epitaxial layer ((100) plane), and the substrate measured 0.8×1.5 cm×10 mils thick. The epitaxial layer had a nominal composition of $In_{0.53}Ga_{0.47}As$ and was doped with beryllium. The back contact to this substrate was an evaporated layer of indium. The capacitance versus votage was measured, as described in Example 10, and was performed at a few contact dots. These measurements showed a p-type carrier concentration of approximately $5 \times 10^{16}$ cm$^{-3}$.

EXAMPLE 12

The procedure of Example 11 was followed except the $In_{0.53}Ga_{0.47}As$ epitaxial layer was not intentionally doped. The n-type carrier concentration was measured at $5 \times 10^{15}$ cm$^{-3}$.

EXAMPLE 13

The procedure of Example 12 was followed except the organic material initially deposited on the substrate was the N,N'-dimethyl diimide of PTCDA. The same value was measured, as found in Example 12.

EXAMPLE 14

Figure 8:
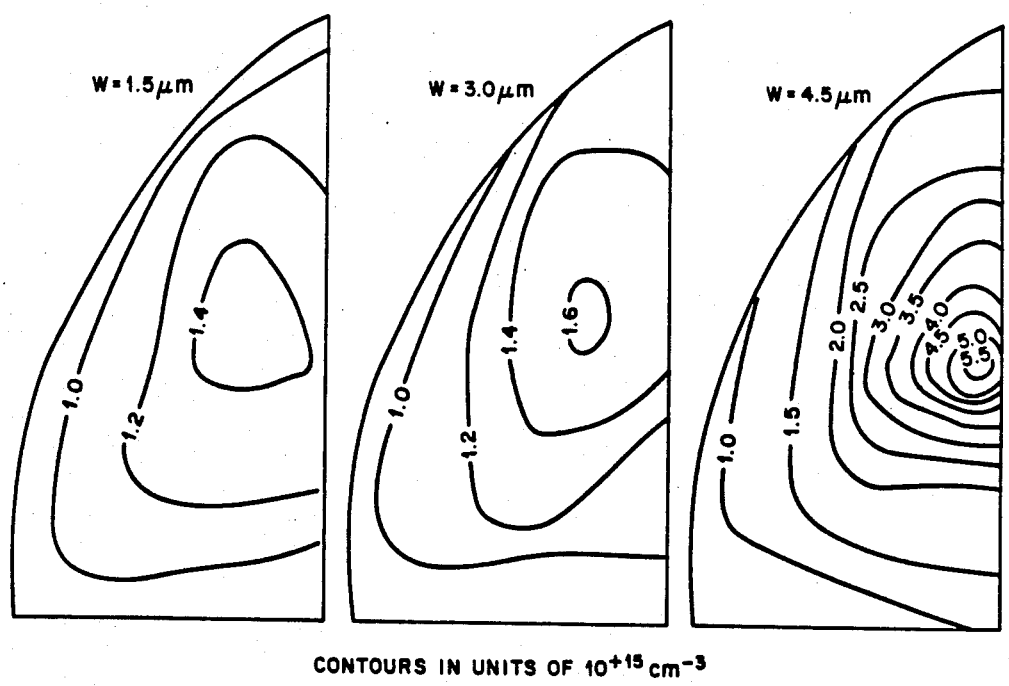
FIGS. 8, 9, 10 and 11 are illustrative of results obtained by the subject invention.
Figure 9:
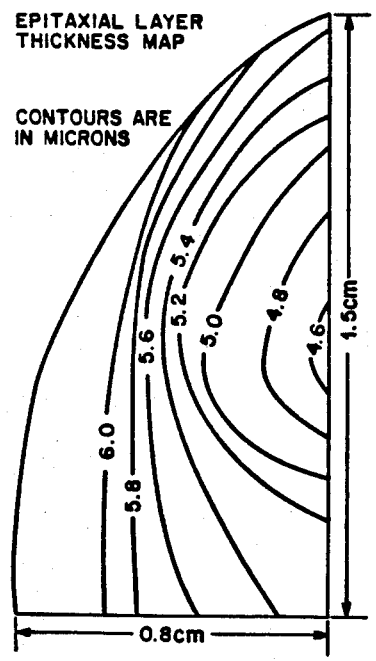

The procedure of Example 12 was followed except the epitaxial layer was indium phosphide with no intentional doping. The C-V measurement was performed at several dots uniformly spaced over the surface of the substrate, and the spatial contours for carrier concentration and thickness are shown in FIGS. 8 and 9. (The dopant concentration is shown at three different depths, W, from the surface).

EXAMPLE 15

Figure 10:
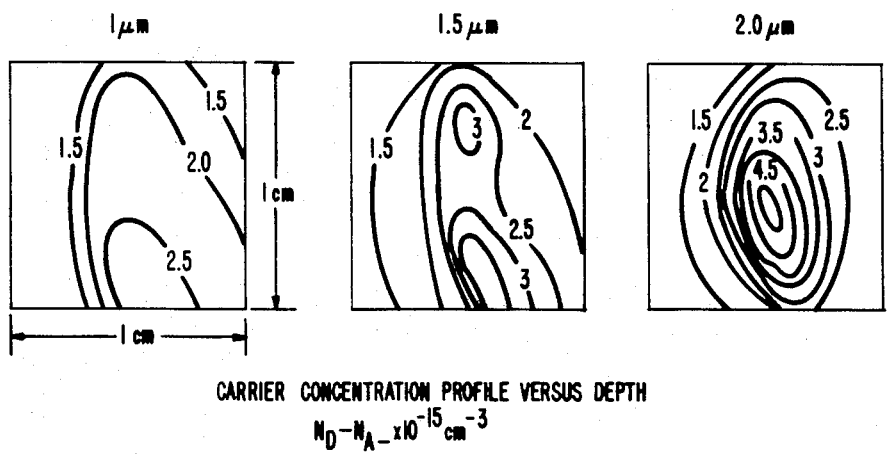

The procedure of Example 12 was followed except the $In_{0.53}Ga_{0.47}As$ layer was not intentionally doped. A contour map was made, as described in Example 14, and the resulting spatial configurations are shown in FIG. 10 for three selective depths measured vertically from the substrate surface.

EXAMPLE 16

Figure 11:
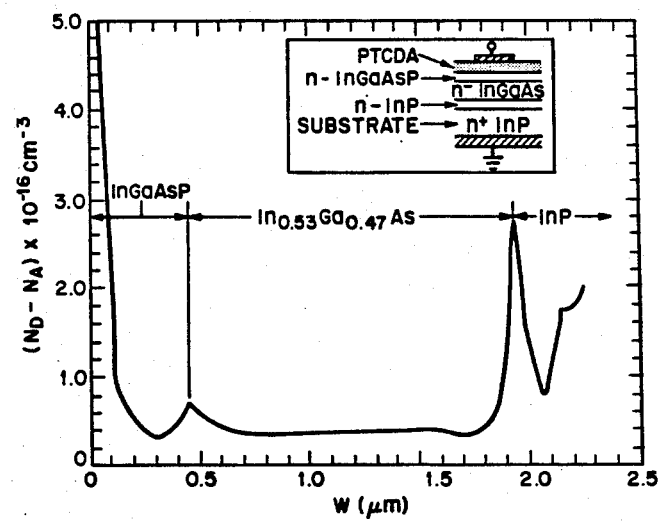

The procedure of Example 12 was followed except the indium phosphide substrate had sequentially deposited epitaxial layers of indium phosphide, $In_{0.53}Ga_{0.47}As$, and indium gallium arsenide phosphide with a stoichiometry yielding a bandgap of approximately 0.95 eV. A C-V measurement was made at one point, and the spatial depth of the various interface layers was clearly shown by spikes, as can be seen in FIG. 11. The tail at 0.1 μm indicated a relatively large surface accumulation of change probably produced by surface defects.

EXAMPLE 17

The procedure of Example 12 was followed except sequential epitaxial layers of $In_{0.53}Ga_{0.47}As$ and indium phosphide were deposited on the indium phosphide substrate. Again, from the C-V measurement, the thicknesses of each layer and their associated carrier concentrations were determined.

EXAMPLE 18

The procedure of Example 12 was followed except subsequent to apparatus evacuation but before sublimation, the substrate was heated to a temperature of approximately 110 degrees C., maintained at this temperature for 10 minutes, and then cooled to a temperature of 70 degrees C.

EXAMPLE 19

The procedure of Example 17 was followed except the organic layer with its overlying indium dot matrix was removed by immersing it in a saturated aqueous solution of KOH for a period of several minutes. The indium back contact was also removed by immersion in a 1:1 solution of concentrated hydrogen chloride in water. Devices were then formed on the substrate, and these devices performed with acceptable characteristics.

What is claimed is:

1. A process for forming a plurality of devices comprising the steps of choosing during said formation a semiconductor region of a representative device of said plurality, measuring at least one property of said region, and completing the formation of all or some of said plurality if said property is satisfactory characterized in that said property is measured by depleting a semiconductor region of said device by applying an electric field across an interface formed by a semiconductor portion of said device and a material chosen from the group consisting of 1,8-naphthalic anhydride, 3,4,9,10-perylenetetracarboxylic dianhydride, 1,4,5,8-naphthalenetetracarboxylic dianhydride, imides and diimides of 3,4,9,10-perylenetetracarboxylic dianhydride, and imides and diimides of 1,4,5,8-naphthalenetetracarboxylic dianhydride.

2. The process of claim 1 wherein said semiconductor region comprises a member of the group consisting of indium phosphide, gallium arsenide, indium gallium arsenide phosphide, silicon, indium gallium arsenide, and gallium aluminum arsenide.

3. The process of claim 1 wherein said device comprises an integrated circuit.

4. The process of claim 1 wherein said device comprises a photodetector.

5. The process of claim 1 wherein said semiconductor portion comprises said semiconductor region.

6. A process for forming a device comprising the steps of measuring at least one property of a semiconductor region of said device during said formation and completing said device if said property is satisfactory characterized in that said property is measured by depleting a semiconductor region of said device by applying an electric field across an interface formed by a semiconductor portion of said device and a material chosen from the group consisting of 1,8-naphthalic anhydride, 3,4,9,10-perylenetetracarboxylic dianhydride, 1,4,5,8-naphthalenetetracarboxylic dianhydride, imides and diimides of 3,4,9,10-perylenetetracarboxylic dianhydride, and imides and diimides of 1,4,5,8-naphthalenetetracarboxylic dianhydride.

7. The process of claim 6 wherein said semiconductor region comprises a member of the group consisting of indium phosphide, gallium arsenide, indium gallium arsenide phosphide, silicon, indium gallium arsenide, and gallium aluminum arsenide.

8. The process of claim 6 wherein said device comprises an integrated circuit.

9. The process of claim 6 wherein said device comprises a photodetector.

10. The process of claim 6 wherein said semiconductor portion comprises said semiconductor region.

* * * * *